(12) United States Patent
Savignac et al.

(10) Patent No.: US 6,256,243 B1
(45) Date of Patent: Jul. 3, 2001

(54) TEST CIRCUIT FOR TESTING A DIGITAL SEMICONDUCTOR CIRCUIT CONFIGURATION

(75) Inventors: Dominique Savignac, Ismaning; Wolfgang Nikutta; Michael Kund, both of München, all of (DE); Jan Ten Bröke, NP Zwolle (NL)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/642,734

(22) Filed: Aug. 17, 2000

Related U.S. Application Data

(63) Continuation of application No. PCT/DE98/02895, filed on Sep. 30, 1998.

(30) Foreign Application Priority Data

Feb. 17, 1998 (DE) .............................. 198 06 455

(51) Int. Cl.[7] ...................................................... G11C 7/00
(52) U.S. Cl. .................. 365/201; 365/200; 365/189.02; 365/189.09
(58) Field of Search ...................................... 365/201, 200, 365/189.01, 189.02, 189.07, 189.12, 230.02

(56) References Cited

U.S. PATENT DOCUMENTS 5,956,277 * 9/1999 Roohparvar .......................... 365/201

* cited by examiner

*Primary Examiner*—David Nelms
*Assistant Examiner*—David Lam
(74) *Attorney, Agent, or Firm*—Herbert L. Lerner; Laurence A. Greenberg; Werner H. Stemer

(57) ABSTRACT

A monolithically integrated test circuit for testing a digital semiconductor circuit configuration that is formed on the same semiconductor chip and has a large number of elements to be tested. The test circuit has a test data pattern register for temporary storage of a test data pattern, a read and write circuit for writing and reading the data in the test data pattern register to and from the elements to be tested, and a comparison circuit. The comparison circuit tests for any difference between the data written to and read from the elements to be tested. The test circuit has a pattern variation circuit, which can be activated by an activation signal and varies the test data pattern from the test data pattern register before writing into the elements to be tested.

21 Claims, 4 Drawing Sheets

TEST CIRCUIT FOR TESTING A DIGITAL SEMICONDUCTOR CIRCUIT CONFIGURATION

CROSS-REFERENCE TO RELATED APPLICATION

This is a continuation of copending International Application PCT/DE98/02895, filed Sep. 30, 1998, which designated the United States.

BACKGROUND OF THE INVENTION

1. Field of the Invention

The invention relates to a monolithically integrated test circuit for testing a digital semiconductor circuit configuration having a large number of elements to be tested. The test circuit is formed on the same semiconductor chip as the circuit configuration under test. The test circuit includes a read and write circuit for writing and reading a test data pattern to and from the elements to be tested, a comparison circuit, and a pattern variation circuit which can be activated by an activation signal.

When testing the operation of a semiconductor memory, as a particularly preferred embodiment of the semiconductor circuit configuration according to the invention, apart from the individual data and address lines, the memory cells are, in particular, checked with regard to manufacturing faults. Since large numbers of cells have to be tested when the semiconductor memories are still part of the wafer, they are generally addressed combined into groups, rather than individually. In such a compression test, the data bits are normally combined into groups and are connected to a smaller number of I/O interfaces (I/O=in-out) than the chip actually has. Depending on the chip architecture, one data bit is in each case written to a number of data lines when a write access is made via the small number of I/O interfaces. When a read access is made, the data bits of these data lines are checked in groups to ensure that they are equal, and the result of this test is output respectively as PASS or FAIL information to the small number of I/O interfaces. One disadvantage of this procedure is that it is impossible to write any desired number of data patterns to the memory, since the data lines that are combined all have a fixed polarity. Since the physical environment of the memory cells is different and can cause polarity-dependent failures, some defective memory cells are overlooked in such a "rigid" test. Such a test is thus useless, since even a single memory cell defect can lead to the entire component being scrapped. A further disadvantage of this procedure is that testing for equality in the situation where all the combined data bits are "wrong" can lead to a supposedly "correct" result.

U.S. Pat. No. 5,418,790 discloses a test circuit for detecting interference for a semiconductor memory apparatus which, for simultaneous investigation of memory cells, programs the memory cells simultaneously with a single test bit that is common to all the memory cells, and combines the determined data values stored on the basis of the test bit such that a check is carried out at the same time to confirm that all the data values are absolutely identical. Furthermore, the previously known apparatus has logic apparatuses which can be activated by a signal, and by which the test bit and the data values determined from the memory cells can be inverted simultaneously before they are combined. However, the previously known apparatus has the disadvantages mentioned above.

SUMMARY OF THE INVENTION

It is accordingly an object of the invention to provide a test circuit for testing a digital semiconductor circuit configuration that overcomes the disadvantages of the prior art devices and methods of this general type, in which a reduced number of addresses and/or IO interfaces at a wafer and chip level are required, which is physically simple, and in which the test accuracy is at the same time improved.

With the foregoing and other objects in view there is provided, in accordance with the invention, a combination of a digital semiconductor circuit configuration formed on a semiconductor chip and having a large number of elements to be tested, and a monolithically integrated test circuit for testing the elements to be tested and formed on the semiconductor chip. The test circuit includes a read and write circuit for writing and reading a test data pattern having a given width to and from the elements to be tested and a test data pattern register for temporarily storing the test data pattern. A pattern variation circuit is provided which receives and is activated by an activation signal. The pattern variation circuit is connected to the test data pattern register and to the read and write circuit. The pattern variation circuit varies the test data pattern received from the test data pattern register before writing it into the elements to be tested. A comparison circuit is connected to the read and write circuit and to the pattern variation circuit. The comparison circuit tests for a difference between written data and read data of the elements to be tested.

The invention provides that a test data pattern register is provided for temporary storage of the test data patterns, and that the pattern variation circuit which can be activated by the activation signal varies the test data pattern from the test data pattern register before writing into the elements to be tested. The comparison circuit is configured in such a way that it tests for a difference between the written and read data of the elements to be tested.

In one particularly preferred embodiment of the invention, the activation signal for activating the pattern variation circuit is supplied via a pad, which is already present on the semiconductor chip, and is connected to the pattern variation circuit. The advantage of this configuration is that the semiconductor circuit configuration can be tested with varying patterns while still part of the wafer, without the test data pattern register having to be reloaded. To do this, it is advantageous for the digital semiconductor circuit configuration to be operable in two modes. The first mode is a normal mode in which the test circuit is deactivated and the semiconductor circuit configuration has the I/O lines associated with it. The second mode is a test mode in which the pad, which is already present on the semiconductor chip, is connected to the pattern variation circuit of the test circuit. The pad is preferably decoupled from the pattern variation circuit in the normal mode and in the normal mode is intended for coupling the digital semiconductor circuit configuration to a signal.

In another preferred embodiment of the invention, the comparison circuit of the test circuit is formed with a number of logic gates corresponding to the width of the test data pattern, which gates compare the data read from and to be written to the semiconductor memory bit-by-bit. Based on this development, the test circuit is advantageously equipped with an addition gate, which is coupled to the logic gates of the comparison circuit. The addition gate, which is advantageously formed by a NOR gate, combines the results of the logic gates of the comparison circuit to form a test result. In this case, a logic "zero" as the result from the NOR gate is then used as a FAIL signal, and a logic "one" is then used as a PASS signal.

In a further preferred embodiment of the invention, the pattern variation circuit is formed by a number of logic gates corresponding to the width of the test data pattern, which gates vary the test data pattern of the test data pattern register bit-by-bit. To do this, the pattern variation circuit can advantageously be activated by an activation signal. The logic gates in the comparison circuit and in the pattern variation circuit are advantageously formed by exclusive-OR gates.

In another preferred embodiment of the invention, the test circuit has a result variation circuit, which contains a number of logic gates corresponding to the width of the test data pattern. The logic gates are connected to the outputs of the logic gates in the comparison circuit and are disposed downstream from which the addition gate is connected to the outputs. The logic gates in the result variation circuit are in this case preferably formed by exclusive-OR gates, which are activated jointly by a result variation signal.

When a read access is made, the data bits in each group are linked to the varied test data pattern bits in such a way that the previous operation is reversed. If no error occurs, all the result bits in a group are the same after this operation, otherwise they differ.

If all the result bits in a group are equal to the expected value, PASS information is output. If at least one result bit does not match the expected value, FAIL information is output. Since the data bit groups belong to separate memory areas, there is no need to test each of these groups with different data. One expected value is thus sufficient for all groups; for this reason, the data pattern bits can be used at the same time for all the groups.

In another preferred embodiment of the invention, the activation signal for the pattern variation circuit is supplied via a semiconductor memory input and output line which is not used in the test mode. Furthermore, the result variation circuit can be activated by the result variation signal via a semiconductor memory input and output line which is likewise not used in the test mode. In consequence, the FAIL or PASS signal can be output via a further semiconductor memory input and output line which is not used in the test mode.

With regard to an address and I/O compression test mode, another major advantage of the invention is that data pattern bits can be inserted using those data bits which are compressed and may have any desired data pattern, so that the entire memory can be tested using the same data patterns as is the case, per se, with a standard test. The invention thus results in a high test accuracy level, and the advantages of compression, in terms of a reduced address area and a reduced number of I/O interfaces, can be exploited.

In a further advantageous embodiment of the invention, a one-from-four multiplexer circuit is provided, whose output signal is the activation signal for the pattern variation circuit, and which supplies one of four data values from a data register as the output signal. The result variation circuit can be activated in a similarly advantageous manner by a one-from-four multiplexer circuit whose output signal is the result variation signal and which supplies one of four data values from a result variation data register as the output signal.

In a further aspect of the invention, the address and I/O compression test mode is controlled in accordance with the JEDEC Standard by three test mode sequences. The first test mode sequence selects the test mode and stores in the chip those test data pattern bits which are used for producing data patterns in the column direction throughout the test. The second test mode sequence stores in the data register those data pattern bits which are used for producing data patterns in the row direction, for write accesses, as a function of the row address and in conjunction with the test data pattern register. The I/O interfaces are ignored for these write accesses. The third test mode sequence stores in the result variation data register those data pattern bits which are used as the result variation signal for read accesses as a function of the row address and in conjunction with the test data pattern register. The second and the third test mode sequence can be used as often as required and independently of one another during a test sequence. This is necessary to allow so-called "march patterns" ("sequential test patterns"), which are composed of sequences of read accesses and subsequent write accesses with inverted data for each memory address.

When a write access is made, one bit is selected from the data register via a multiplexer, as a function of the row address, and is linked to the test data pattern bits in the test data pattern register. This can be done, for example, using exclusive-OR gates. The resultant data bits are used as a write data for each group. Those data bits in each group that are written in the associated memory area may thus have any required pattern in the column direction and in the row direction.

When a read access is made, the data bits in each group are linked to the data pattern bits in such a way that the previous operation is reversed. This can be done in this case as well using exclusive-OR gates. If no fault has occurred, all the result bits in a group are identical after this operation; otherwise, they differ. The result bits in each group are then each compared with a result variation signal, which is selected from the result variation data register via a multiplexer, as a function of the row address. If all the result bits in a group are the same as the result variation signal, PASS information is passed to the corresponding IO interfaces (for example logic "1"). If at least one result bit does not match the result variation signal, FAIL information is output (for example logic "0").

A simple test sequence is advantageously composed of the below listed steps.

a). Test mode sequence 1. The test mode is selected and the test data pattern register is loaded.

b). Test mode sequence 2. The data register is loaded.

c). Write a data background.

d). Test mode sequence 3. The result variation data register is loaded with the data from step b.

e). Test mode sequence 2. The data register is loaded with new write data.

f). For each memory address, read access to the data from step c, write access with data from step e.

g). Test mode sequence 3. The result variation data register is loaded with the data from step e.

h). Read the data which was written in step f.

i). The test mode is switched off (in accordance with the JEDEC Standard).

Since the data bit groups belong to independent memory areas, there is no need to test each of these groups with different data. The test data pattern register, the data register and the result variation data register together with their associated multiplexers can thus be used for all the groups at the same time.

Other features which are considered as characteristic for the invention are set forth in the appended claims.

Although the invention is illustrated and described herein as embodied in a test circuit for testing a digital semiconductor circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
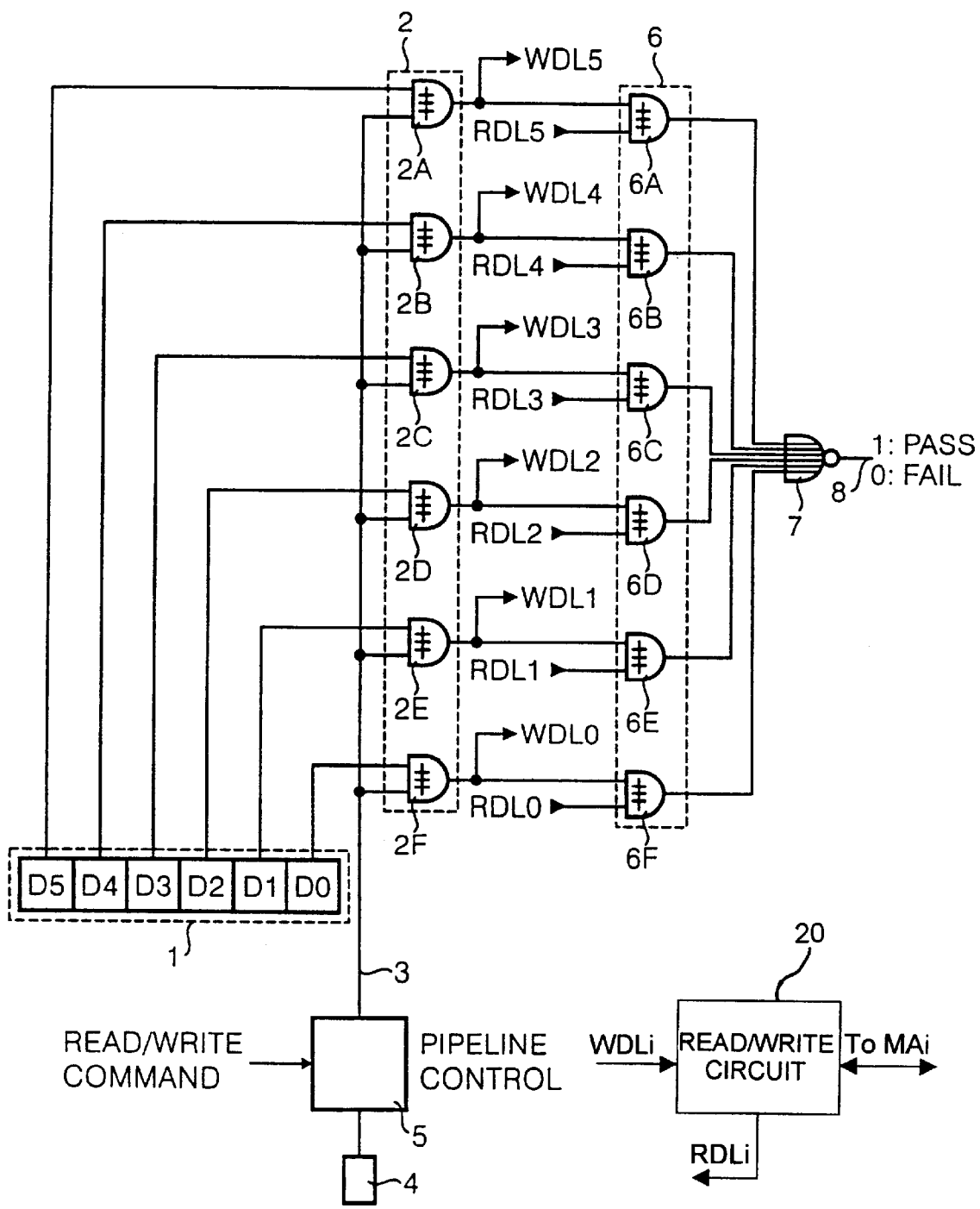
FIG. 1 is a circuit diagram of a test circuit based on a first exemplary embodiment of the invention.

In all the figures of the drawing, sub-features and integral parts that correspond to one another bear the same reference symbol in each case. Referring now to the figures of the drawing in detail and first, particularly, to FIG. 1 thereof, there is shown an exemplary embodiment of a test circuit which is monolithically integrated on a semiconductor chip (not shown in any more detail). The test circuit tests memory cells of a semiconductor memory with a test data pattern stored in a test data pattern register. The register 1 contains, for example, six logic bits D0 to D5 and may be in the form of a semiconductor circuit configuration register which is not used in a test mode. Downstream of the register 1 is a number (in this case six) of exclusive-OR gates 2A to 2F corresponding to a width of the test data pattern, and the gates 2A to 2F form a pattern variation circuit 2. The pattern variation circuit 2 varies or inverts the test data pattern bit-by-bit. The variation of the test data pattern is initiated by applying a logic "one" as an activation signal 3 to the exclusive-OR gates 2A to 2F. The activation signal 3 is in this case applied via a pad 4 which is formed on the semiconductor chip and may in this case be formed by the pad 4 (which is not used in the test mode) of a data control input (DATACTRL) of the semiconductor circuit. The pad 4 may be connected to the pattern variation circuit 2 by a data control unit 5 that is activated in the test mode. Write data lines WDL0 to WDL5 are connected downstream of the pattern variation circuit 2, via which lines the unchanged or varied test data patterns are written by a write and read circuit 20 to the open cells in the semiconductor memory. An output side of the pattern variation circuit 2 furthermore has a comparison circuit 6 assigned to it, which is composed of a number of exclusive-OR gates 6A to 6F corresponding to the width of the test data pattern. Inputs of the exclusive-OR gates 6A to 6F in this case have the varied test data pattern applied to them, and also have those data contents of the open cells in the semiconductor memory which are applied via the read data lines RDL0 to RDL5 applied to them. If any difference occurs between the levels applied to the write data lines WDL0 to WDL5 for writing to the semiconductor memory and the levels read from the semiconductor memory and applied to the read data lines RDL0 to RDL6, then the output of the relevant logic gate changes to a logic "one" level; otherwise, it changes to a logic "zero" level. The comparison circuit 6 is followed by an addition gate 7 which is assigned to the outputs of the exclusive-OR gates 6A to 6F and is formed by a NOR gate 7 provided with a number of inputs corresponding to the number of logic gates in the comparison circuit 6. A logic "one" level is produced at an output 8 of the NOR gate 7 only when all the inputs of the NOR gate 7 are at logic "zero", that is to say there is no difference between a written and a read data bit, and this corresponds to a PASS signal; otherwise, the output is a logic "zero", which corresponds to a FAIL signal. The output 8 of the addition gate 7 thus remains at a logic "one" level throughout the entire test of the semiconductor memory, and changes to a logic "zero" level as soon as a fault occurs. If, for example, a test data pattern with the sequence D0 to D5=1,0,1,0,1,1 is written to the test data pattern register 1, then this is inverted to produce the data bits 0,1,0,1,0,0 by the pattern variation circuit 2, once it has been activated, and is written via the write data lines WDL0 to WDL5 to the memory cells. The contents of the memory cells are compared with the varied test data pattern via the read data lines RDL0 to RDL5. If it is assumed that one memory cell connected to the write or read data line WDL4 or RDL4 is defective, then a logic "one" will be produced at the output of the logic gate 6B. This would result in a logic "zero", that is to say an FAIL signal, being produced at the output of the addition gate 7.

Figure 2:
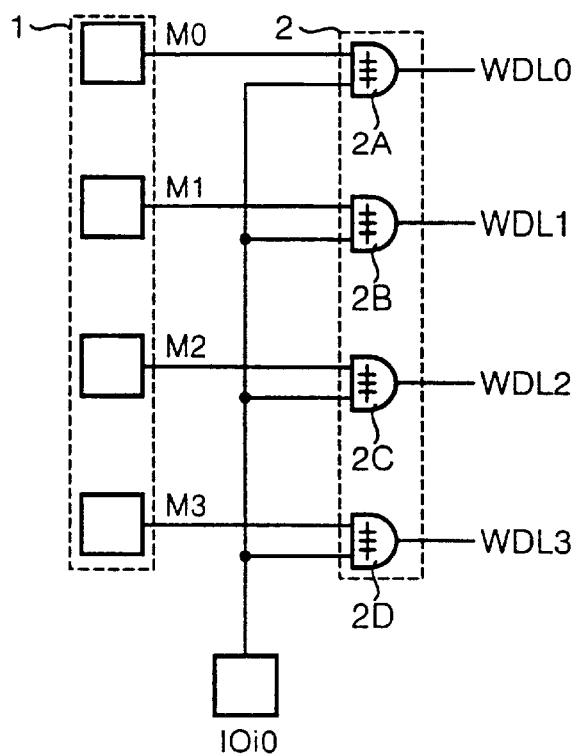
FIG. 2 is a circuit diagram of that part of the test circuit which is required for a write procedure, with one I/O interface and four data channels, based on a second exemplary embodiment of the invention.

FIG. 2 shows the part that is required for writing in a further embodiment of the invention, with only the test data pattern register 1 and the pattern variation circuit 2 being illustrated. The pattern variation circuit 2 in the illustrated example contains four exclusive-OR gates 2A to 2D, each having two inputs. The activation signal 3 is jointly applied to one input of each of the logic gates 2A–2D via an associated I/O interface IOi0 of the semiconductor memory, which I/O interface would otherwise not be required in the test mode, in order to address the semiconductor memory. The respective second inputs of the logic gates 2A–2D each have a test data pattern bit M0 to M3 applied to them, from the test data pattern register 1. The outputs of the logic gates 2A–2D are connected to the write data lines WDL0 to WDL3 of the data memory block in the semiconductor memory. When a test data pattern bit is logic 0, the respective data bit at the output of the logic gate has the same polarity as the information at the I/O interface; otherwise, it has the opposite polarity. The four data bits in a group may thus have any required pattern, even though only one I/O interface is used for writing.

Figure 3:
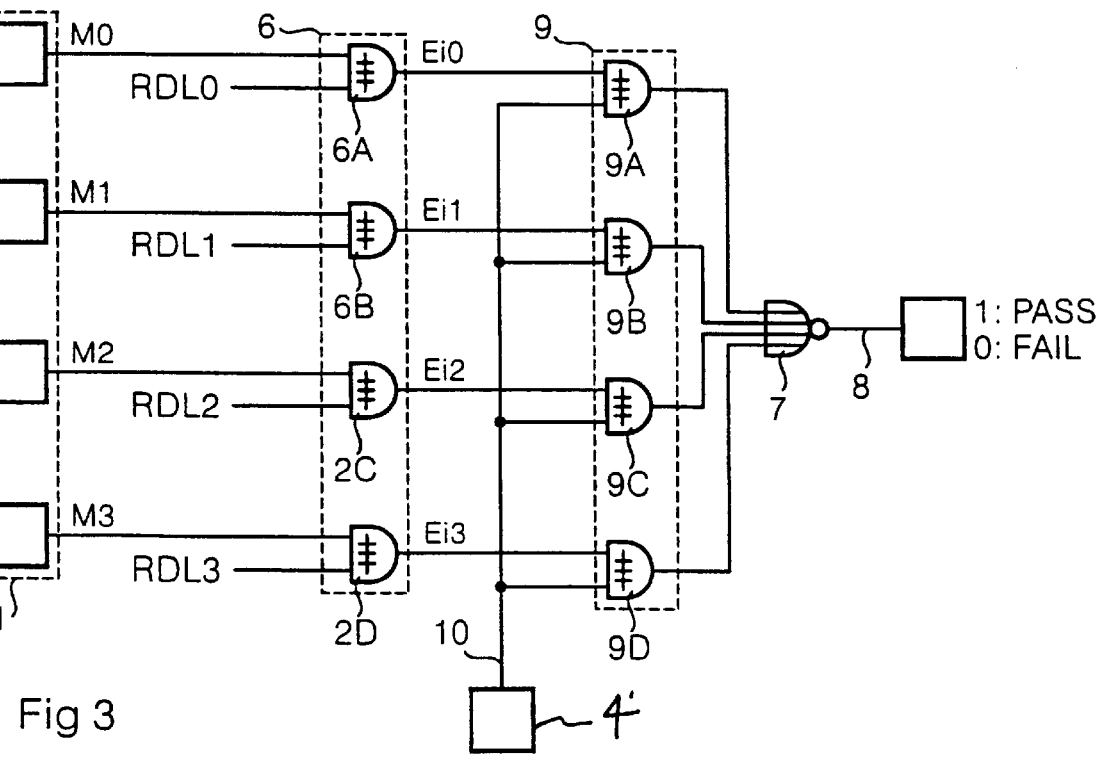
FIG. 3 is a circuit diagram of the part of the test circuit for a read procedure, with four data channels and one interface, based on the second exemplary embodiment of the invention.

FIG. 3 shows the part required for reading in a further embodiment of the invention. FIG. 3 shows the test data pattern register 1, the comparison circuit 6 and the NOR gate 7, which operate as already described. In the illustrated example, the comparison circuit 6 contains four exclusive-OR gates 6A to 6D, each having two inputs, which each link one data bit of the read data line RDL0 to RDL3 and one test data pattern bit M0 to M3 from the test data pattern register 1. After this operation, the polarities of all the outputs are the same, provided no difference (fault) has occurred. These result bits Ei0 to Ei3 are linked to four further exclusive-OR gates 9A to 9D in a result variation circuit 9.

The result variation circuit 9 varies or inverts the results from the comparison circuit 6 bit by bit. The variation of the results is initiated by applying a logic "one" as a result variation signal 10 to the exclusive-OR gates 9A to 9D. The result variation signal 10 is in this case applied to the result variation circuit 9 via a pad, a register memory cell or an I/O interface 4' which is not required for addressing the semiconductor memory in the test mode. The outputs of the exclusive-OR gates 9A to 9D in the result variation circuit 9 are, finally, combined using the NOR gate 7, whose output 8 is logic 0, as soon as at least one applied bit is logic 1 (that is to say incorrect). The output of the NOR gate 7 in this exemplary embodiment of the invention is connected to an I/O line which is not required by the semiconductor memory in the test mode and via which the result of the test run is output externally. The result of the addition gate (NOR gate 7) is covered by the same statements as those in the description relating to FIG. 1.

Apart from the deactivation of the normal circuit parts and the activation of the test circuit, the data path and the I/O interfaces are controlled as in the normal mode. For the sake of simplicity, these control signals are not shown.

Figure 4:
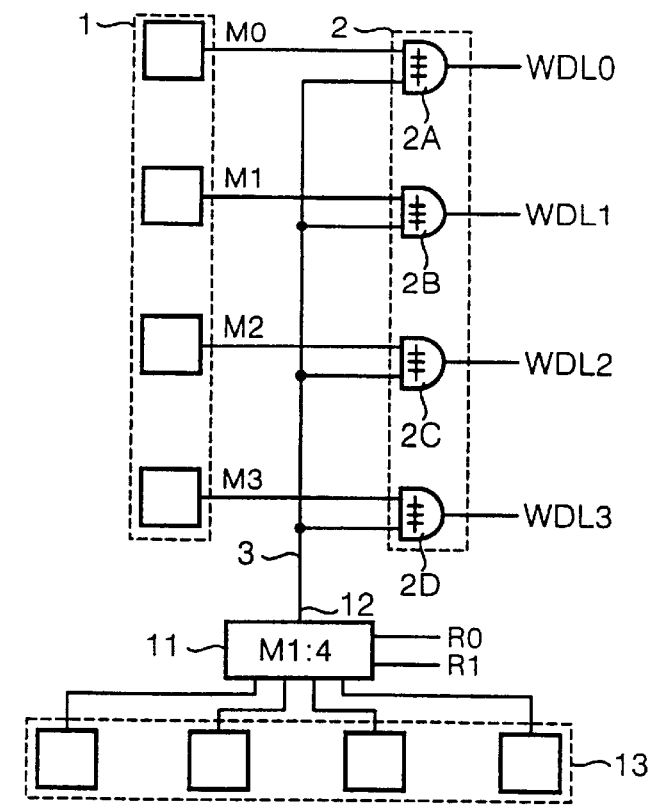
FIG. 4 is a circuit diagram of that part of the test circuit which is required for the write procedure, with four data channels, based on a third exemplary embodiment of the invention.

FIG. 4 shows a modification of the embodiment of the invention described in FIG. 2. In this case, the activation signal 3 for activating the pattern variation circuit 2 is provided at an output 12 of a one-from-four multiplexer circuit 11. The one-from-four multiplexer circuit 11 in this case applies one of four data bits from a data register 13 to the output 12. In this case, the data bit is selected from the data register 13 via the row addresses R0 and R1. The data bits which are written to the semiconductor memory may thus have any required pattern in the column direction and in the row direction (in this case, the pattern depth is 4×4).

Figure 5:
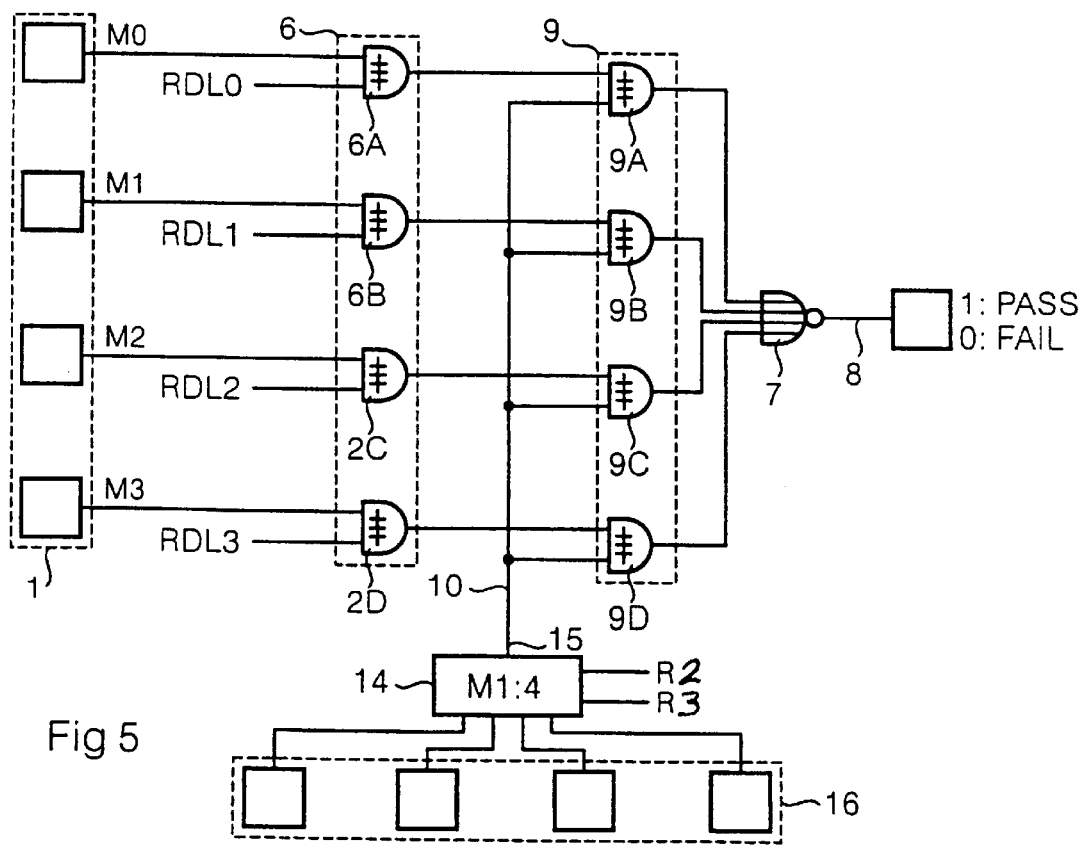
FIG. 5 is a circuit diagram of the part of the test circuit for the read procedure, with the four data channels and the one interface, based on a third exemplary embodiment of the invention.

FIG. 5 shows a modification of the embodiment of the invention described in FIG. 3. In this case, the result variation signal 10 for activating the result variation circuit 9 is provided at the output 15 of a one-from-four multiplexer circuit 14. The one-from-four multiplexer circuit 14 in this case applies one of four data bits from a result variation data register 16 to the output 15. The selection of the data bit from the result variation data register 16 is in this case carried out via the row addresses R2 and R3. The one-from-four multiplexer circuit 14, the result variation data register 16 and the row addresses R2 and R3 may in this case be identical to those in FIG. 4. The two data registers 13 and 16 may in this case also be formed jointly by a single register with a width of eight bits.

On entering a test mode, which, in accordance with the JEDEC Standard, is initiated via so-called "IPL sequences", the test data pattern register 1 and the data registers 13 and/or 16 are loaded via four address lines via the test mode sequence a), b) and c) or, if the one-from-four multiplexer circuit is not present, the activation signal 3 and the result variation signal 10 are provided via address or I/O lines.

Figure 6:
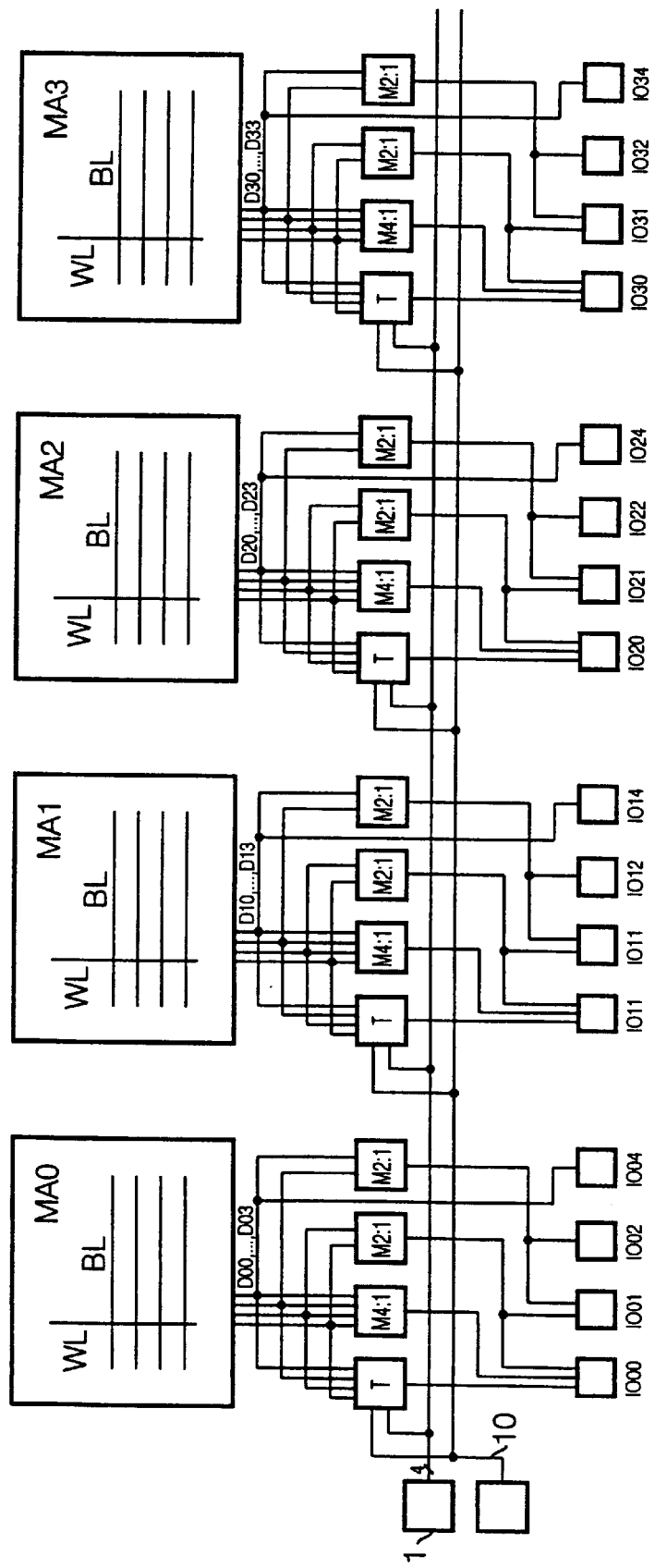
FIG. 6 is a block circuit diagram of a data path of a digital semiconductor memory with an x4, x8 and x16 organization.

FIG. 6 shows a schematic illustration of the data path in a semiconductor memory in the form of an SDRAM, which allows an x4, an x8 and an x16 organization. Modern memories are normally subdivided into a number of blocks, for example into the four blocks MA0, MA1, MA2 and MA3. These blocks are not necessarily physically separated from one another. The subdivision should in this case be regarded as meaning that a certain number of data bits are accessible when each block is accessed, for example four data bits D00 to 03, D10 to 13, D30 to 33 in each case, which each originate from an active word line WL, and with clear word and column addresses. These data bits may possibly originate from a number of word lines WL if, in the event of a repair, all these word lines are simultaneously replaced by a redundant word line.

In an x4 organization, two address bits of the column address are used to make a one-from-four selection via multiplexers M4:1. The outputs of the multiplexers M4:1 are each connected to one I/O interface (IO00, IO01, ..., IO30). In an x8 organization, one address bit of the column address is used to make a one-from-two selection via multiplexers M2:1. The outputs of the multiplexers M2:1 are each connected to 2 I/O interfaces (IO00 to 01, ..., IO30 to 31). Finally, in an x16 organization, four data bits are in each case connected to four I/O interfaces (IO00 to 03, ..., IO30 to 33) in each block. As is shown in FIG. 1, these data bits may in some cases be supplied to the I/O interfaces via the multiplexers mentioned above, in order to save lines.

One test circuit T according to the invention is provided for each block MA0, ..., MA3, and is connected between the respective four data bits and the I/O interface in the x4 organization (IO00, ..., IO30). Each of the test circuits T can have the test data pattern register 1 (pattern depth four) applied to it via four lines, and the result variation signal and the activation signal 3 applied to it via one respective line. The test data pattern register 1 is loaded via four address lines on entering the test mode. Irrespective of the data organization, the normal multiplexers and the normal I/O interfaces are deactivated during the test mode, and the test circuits T together with their associated I/O interfaces are activated.

For each read access, the result variation signal 10 is applied, for example, via a column address which is not used for the test mode owing to the saving of I/O lines (not all the I/O lines are required), and is provided via an internal register, or via the described variants with the aid of pads, or via the described multiplexer circuits.

The described implementation of the invention uses the same databus structure as in the normal mode, with four I/O interfaces out of sixteen being used to output the test result. In a further implementation, however, four times as many memory cells are activated as in the normal mode. With sixteen test circuits instead of four, the test results can be output at four groups of four I/O interfaces in each case. The number of I/O interfaces in this implementation is admittedly not reduced, but the address area is reduced further by a factor of four.

We claim:

1. In combination with a digital semiconductor circuit configuration formed on a semiconductor chip and having a large number of elements to be tested, a monolithically integrated test circuit for testing the elements to be tested and formed on the semiconductor chip, the test circuit comprising:

a read and write circuit for writing and reading a test data pattern having a given width to and from the elements to be tested;

a test data pattern register for temporarily storing the test data pattern;

a pattern variation circuit receiving and activated by an activation signal and connected to said test data pattern register and to said read and write circuit, said pattern variation circuit varying the test data pattern received from said test data pattern register before writing into the elements to be tested; and a comparison circuit connected to said read and write circuit and to said pattern variation circuit, said comparison circuit testing for a difference between a written data and a read data of the elements to be tested.

2. The test circuit according to claim 1, wherein the semiconductor chip has a pattern variation circuit pad to be coupled to said pattern variation circuit, said pattern variation circuit pad supplying the activation signal for activating said pattern variation circuit.

3. The test circuit according to claim 2, wherein the digital semiconductor circuit configuration is operable in two modes including a normal mode and a test mode, in the test mode said pattern variation circuit pad is connected to said pattern variation circuit of the test circuit and, in the normal mode the pattern variation circuit pad couples the digital semiconductor circuit configuration to a signal.

4. The test circuit according to claim 3, wherein in the normal mode, the pattern variation circuit pad is decoupled from said pattern variation circuit.

5. The test circuit according to claim 3, wherein said comparison circuit has a number of logic gates corresponding to the given width of the test data pattern, said logic gates comparing the written data and the read data bit-by-bit and have outputs for outputting comparison results.

6. The test circuit according to claim 5, including an addition gate coupled to said logic gates of said comparison circuit, said addition gate logically combining the comparison results of said logic gates of said comparison circuit to form a result.

7. The test circuit according to claim 6, wherein said addition gate is a NOR gate.

8. The test circuit according to claim 5, wherein said pattern variation circuit has a number of logic gates corresponding to the given width of the test data pattern, said logic gates of said pattern variation circuit varying the test data pattern bit-by-bit if the activation signal is applied to said pattern variation circuit.

9. The test circuit according to claim 8, wherein said logic gates of said comparison circuit and of said pattern variation circuit are exclusive-OR gates.

10. The test circuit according to claim 5, including:

a result variation circuit having a number of logic gates corresponding to the given width of the test data pattern, said logic gates of said result variation circuit connected to said outputs of said logic gates of said comparison circuit, and said logic gates of said result variation circuit having outputs; and an addition gate connected to said outputs of said logic gates of said result variation circuit.

11. The test circuit according to claim 10, wherein said logic gates of said result variation circuit are exclusive-OR gates.

12. The test circuit according to claim 10, wherein said logic gates of said result variation circuit receive and are activated jointly by a result variation signal.

13. The test circuit according to claim 10, wherein the digital semiconductor circuit configuration has a semiconductor memory input and output to be coupled to said result variation circuit, said result variation circuit is activated by a result variation signal supplied from the semiconductor memory input and output line which is not used in the test mode.

14. The test circuit according to claim 10, wherein the digital semiconductor circuit configuration has a semiconductor memory input and output, and a result of said addition gate is output via the semiconductor memory input and output line that is not used in the test mode.

15. The test circuit according to claims, including:

a one-from-four multiplexer circuit connected to and activating said result variation circuit, said one-from-four multiplexer circuit supplying an output signal being a result variation signal received by and activating said result variation circuit; and a result variation data register connected to and outputting to said one-from-four multiplexer circuit four data values, said one-from-four multiplexer circuit outputting one of the four data values from said result variation data register as the result variation signal.

16. The test circuit according to claim 3, wherein the digital semiconductor circuit configuration has a semiconductor memory input and output to be coupled to said pattern variation circuit, and said pattern variation circuit is activated by the activation signal supplied from the semiconductor memory input and output line which is not used in the test mode.

17. The test circuit according to claim 1, wherein the digital semiconductor circuit configuration having the large number of elements to be tested is a semiconductor memory having a large number of memory cells.

18. The test circuit according to claim 1, wherein said comparison circuit is connected directly to said test pattern register.

19. The test circuit according to claim 1, including:

a one-from-four multiplexer circuit connected to said pattern variation circuit and supplying an output signal being the activation signal for activating said pattern variation circuit; and a further data register connected to and providing said one-from-four multiplexer circuit with four data values, said one-from-four multiplexer circuit supplying one of the four data values from said further data register as the activation signal.

20. A method for testing a chip, which comprises the steps of:

providing a digital semiconductor circuit configuration having a large number of elements to be tested and formed on a semiconductor chip, the semiconductor chip further having a test circuit monolithically integrated therein, the test circuit having a test data pattern register for temporary storage of a test data pattern, a read and write circuit for writing and reading the test data pattern to and from the elements to be tested, and a comparison circuit for testing for any difference between data written to and data read from the elements to be tested; and varying the test data pattern stored in the test data pattern register before it is written to the elements to be tested.

21. The method according to claim 20, which comprises supplying an activation signal from an electrically coupled test circuit pad on the semiconductor chip to initiate the test data pattern variation.

* * * * *